(12) United States Patent
Borghese

(10) Patent No.: US 12,375,068 B2
(45) Date of Patent: Jul. 29, 2025

(54) CONTROL CIRCUIT FOR A SWITCHING STAGE OF AN ELECTRONIC CONVERTER AND CORRESPONDING CONVERTER DEVICE

(71) Applicant: STMicroelectronics S.r.l., Agrate Brianza (IT)

(72) Inventor: Marco Borghese, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 168 days.

(21) Appl. No.: 18/350,380

(22) Filed: Jul. 11, 2023

(65) Prior Publication Data

US 2024/0048131 A1 Feb. 8, 2024

(30) Foreign Application Priority Data

Aug. 5, 2022 (IT) .......................... 102022000016866

(51) Int. Cl.
| | |
|---|---|
| *H02M 1/00* | (2007.01) |
| *H02M 3/157* | (2006.01) |
| *H03K 3/03* | (2006.01) |
| *H03K 7/08* | (2006.01) |

(52) U.S. Cl.
CPC ........ *H03K 3/0315* (2013.01); *H02M 1/0025* (2021.05); *H02M 3/157* (2013.01); *H03K 7/08* (2013.01)

(58) Field of Classification Search
None
See application file for complete search history.

(56) References Cited

U.S. PATENT DOCUMENTS

| | | | | |
|---|---|---|---|---|
| 7,638,993 | B2* | 12/2009 | Valentino | H02M 3/157 323/284 |
| 11,527,957 | B2* | 12/2022 | Karri | H02M 3/1582 |
| 11,736,009 | B2* | 8/2023 | Suraci | H02M 1/0032 323/271 |
| 12,051,965 | B2* | 7/2024 | Borghese | H02M 3/158 |

(Continued)

OTHER PUBLICATIONS

L. Wuidart, "Application note AN513/0393, Topologies for Switched Mode Power Supplies", 1999, STMicroelectronics, 18 pages.

(Continued)

*Primary Examiner* — Cassandra F Cox
(74) *Attorney, Agent, or Firm* — Slater Matsil, LLP

(57) ABSTRACT

A control circuit for a switching stage of an electronic converter includes a PWM signal generator that generates a PWM signal to drive the switching stage of the electronic converter. A loop comparator circuit receives the regulated output voltage of the electronic converter and receives a sum signal from an adder circuit. The loop comparator circuit generates a comparison signal having a first or second logic value in response to the regulated output voltage reaching the sum signal or failing to reach the sum signal. The adder circuit generates the sum signal as a sum of a reference voltage and a programmable offset voltage that is generated by a programmable voltage generator based on a digital word signal. A feedback circuit is coupled to the loop comparator circuit and the PWM signal generator, and provides the digital word signal to the programmable voltage generator.

20 Claims, 8 Drawing Sheets

(56) References Cited

U.S. PATENT DOCUMENTS

2015/0194880 A1 7/2015 Wibben
2019/0123641 A1 4/2019 Couleur et al.

OTHER PUBLICATIONS

Miao, Botao et al., "Detection of Instability and Adaptive Compensation of Digitally Controlled Switched-Mode Power Supplies", Applied Power Electronics Conference And Exposition, 2005, APEC 2005, Twentieth Annual IEEE Austin, TX, Mar. 6-10, 2005, Piscataway, NJ, USA, IEEE, US, vol. 1, 7 pages.

\* cited by examiner

CONTROL CIRCUIT FOR A SWITCHING STAGE OF AN ELECTRONIC CONVERTER AND CORRESPONDING CONVERTER DEVICE

CROSS-REFERENCE TO RELATED APPLICATIONS

This application claims priority to Italian Application No. 102022000016866, filed on Aug. 5, 2022, which application is hereby incorporated herein by reference.

TECHNICAL FIELD

The present disclosure generally relates to DC-DC converter circuits and methods of operation thereof.

One or more embodiments may be applied to switching DC-DC converters in power management integrated circuits.

BACKGROUND

Power-supply circuits, such as AC/DC or DC/DC switched mode power supplies, are well known in the art. There exist many types of electronic converters, which are mainly divided into isolated and non-isolated converters. For instance, non-isolated electronic converters are the converters of the "buck", "boost", "buck-boost", "Ćuk", "SEPIC", and "ZETA" type. Instead, isolated converters are, for instance, converters of the "flyback", "forward", "half-bridge", and "full-bridge" type. Such types of converters are well known to the person skilled in the art, as evidenced e.g. by the application note AN513/0393 *"Topologies for Switched Mode Power Supplies"*, L. Wuidart, 1999, STMicroelectronics.

A conventional DC-DC converter comprises a power stage configured to provide a regulated DC voltage level and a control loop to control the power stage in providing such a regulated DC voltage level. For instance, the control loop conventionally comprises a feedback network.

The control loop can be configured to provide for an operation mode currently referred to as "high-power operative mode" or as continuous conduction mode (briefly, CCM). For instance, this operation mode preserves efficiency at light loads while relaxing the precision of the regulation provided, e.g., via the integrator included in the control loop of the converter.

Conventional DC-DC converters use a reduced electric current (e.g., provided via power management integrated circuits—PMIC) when an application goes in idle or in low-power mode (also known as discontinuous current mode—DCM or burst mode). In such an operational mode, the integrator along the control loop may become unstable.

For instance, when the load current falls down to the order of the milliAmpere or of hundreds of microAmpere, a few microAmpere of current can have a significant impact on the overall efficiency of the DC-DC converter.

An existing solution to overcome the efficiency drop at light loads involves replacing the integrator with a loop comparator, whose improved stability comes at the cost of a reduced precision in load (current) regulation.

Such an existing solution presents the drawback that the replacement of the integrator by the loop comparator affects appreciably the regulated voltage whenever there is a change of state, e.g., from high-power to low-power mode.

Existing ways to mitigate the above problems involve: forcing a lower regulated voltage passing into low-power mode, or forcing an open loop delay in the loop comparator transition.

Both these existing approaches present the drawback of being ripple dependent, with limited flexibility and effectiveness.

SUMMARY

The present disclosure generally relates to DC-DC converter circuits and methods of operation thereof. One or more embodiments may be applied to switching DC-DC converters in power management integrated circuits.

The present disclosure provides one or more embodiments which contribute in overcoming the aforementioned drawbacks of the existing approaches.

In one or more embodiments, a control circuit is provided that at least partially overcomes the drawbacks of the existing approaches.

One or more embodiments may relate to a corresponding electronic converter.

One or more embodiments may relate to a corresponding method.

In one or more embodiments, the present disclosure provides a method of providing at least one PWM signal to a switching stage of an electronic converter.

One or more embodiments facilitate providing precise voltage regulation even in case of operation in low consumption mode, while also preserving reduced current consumption and efficiency.

One or more embodiments provide a dynamic routine to perform equalization of a "valley" in the regulated voltage signal, facilitating to overcome limits of existing solutions.

One or more embodiments provide a solution that works in a same manner irrespective of the specific value of the supply voltage, frequency, and other variable parameters of the DC converter architecture.

One or more embodiments may introduce an offset into the loop comparator when the DC-DC converter is in "high-power" mode.

For instance, such an offset is configured to pre-compensate the voltage error that would otherwise be present in controlling "valleys" (that is, minima) of the signal of the regulated voltage rather than its mean value when in low-power mode.

In at least one embodiment, a control circuit for a switching stage of an electronic converter is provided. The electronic converter is configured to provide a regulated output voltage at an output node based on an input voltage received at an input node. The switching stage is configured to be coupled to a reactive network referred to ground. The control circuit includes a pulse-width modulated (PWM) signal generator configured to generate a PWM signal to drive the switching stage. An error amplifier has a first error amplifier node coupled to the output node and configured to receive the regulated output voltage, and a second error amplifier node coupled to a reference voltage. The error amplifier is configured to generate an error signal based on a difference between the reference voltage and the regulated output voltage. A programmable voltage generator is configured to generate a programmable offset voltage based on a digital word signal. An adder circuit is coupled to the programmable voltage generator and configured to receive the programmable offset voltage. The adder circuit is configured to generate a sum signal based on a sum of a reference voltage level and the programmable offset voltage.

A loop comparator circuit has a first comparator node coupled to the output node and configured to receive the regulated output voltage and a second comparator node coupled to the adder circuit and configured to receive the sum signal. The loop comparator circuit is configured to generate a comparison signal having a first logic value in response to the regulated output voltage reaching a level of the sum signal and having a second logic value in response to the regulated output voltage failing to reach the level of the sum signal. In a first operating mode, the PWM signal generator is configured to repeat the following switching phases for each switching cycle of a sequence of switching cycles: for a first switching phase, generate the PWM signal having a first logic value, and for a subsequent second switching phase, generate the PWM signal having a second logic value. In the first operating mode, the PWM generator is configured to determine the duration of the first switching phase or the second switching phase based on the error signal. In a second operating mode, the PWM generator is configured to determine the duration of the first switching phase or the second switching phase based on the comparison signal. A feedback circuit is coupled to the loop comparator circuit, the PWM signal generator, and the programmable voltage generator. The feedback circuit is configured to receive the comparison signal, receive the PWM signal, and to provide the digital word signal to the programmable voltage generator. The feedback circuit includes flagging circuitry and logic circuitry. The flagging circuitry is configured to measure a difference between the duration of at least one of the first switching phase or the second switching phase between consecutive switching cycles of the sequence of switching cycles during the first operating mode and to generate a flag signal having the first logic value in response to the measured difference reaching a threshold value and having the second logic value in response to the measured difference failing to reach the threshold value. The logic circuitry is configured to, based on at least one of the flag signal or the comparison signal, increase or decrease the digital word signal with respect to a preset digital word value, and vary the offset voltage generated by the programmable voltage generator.

In at least one embodiment, an electronic converter is provided that includes a first node configured to receive an input voltage, a second node configured to provide a regulated output voltage, a load coupled to the second node and configured to receive the regulated output voltage, a switching node coupled to a reactive network referred to ground, and a switching stage coupled to the first node and to the switching node. A control circuit is coupled to the switching stage and configured to provide at least one pulse-width modulated (PWM) signal to the switching stage based on the regulated output voltage and the reference voltage. The control circuit includes: a PWM signal generator configured to generate the PWM signal to drive the switching stage; an error amplifier having a first error amplifier node coupled to the output node and configured to receive the regulated output voltage, and a second error amplifier node coupled to a reference voltage, the error amplifier configured to generate an error signal based on a difference between the reference voltage and the regulated output voltage; a programmable voltage generator configured to generate a programmable offset voltage based on a digital word signal; an adder circuit coupled to the programmable voltage generator and configured to receive the programmable offset voltage, the adder circuit being configured to generate a sum signal based on a sum of a reference voltage level and the programmable offset voltage; and a loop comparator circuit having a first comparator node coupled to the output node and configured to receive the regulated output voltage and a second comparator node coupled to the adder circuit and configured to receive the sum signal, the loop comparator circuit configured to generate a comparison signal having a first logic value in response to the regulated output voltage reaching a level of the sum signal and having a second logic value in response to the regulated output voltage failing to reach the level of the sum signal. In a first operating mode, the PWM signal generator is configured to repeat the following switching phases for each switching cycle of a sequence of switching cycles: for a first switching phase, generate the PWM signal having a first logic value, and for a subsequent second switching phase, generate the PWM signal having a second logic value. In the first operating mode, the PWM generator is configured to determine the duration of the first switching phase or the second switching phase based on the error signal. In a second operating mode, the PWM generator is configured to determine the duration of the first switching phase or the second switching phase based on the comparison signal. The control circuit further includes a feedback circuit that is coupled to the loop comparator circuit, the PWM signal generator, and the programmable voltage generator. The feedback circuit is configured to receive the comparison signal, receive the PWM signal, and to provide the digital word signal to the programmable voltage generator. The feedback circuit includes flagging circuitry and logic circuitry. The flagging circuitry is configured to measure a difference between the duration of at least one of the first switching phase or the second switching phase between consecutive switching cycles of the sequence of switching cycles during the first operating mode and to generate a flag signal having the first logic value in response to the measured difference reaching a threshold value and having the second logic value in response to the measured difference failing to reach the threshold value. The logic circuitry is configured to, based on at least one of the flag signal or the comparison signal, increase or decrease the digital word signal with respect to a preset digital word value, and vary the offset voltage generated by the programmable voltage generator.

In at least one embodiment, a method is provided that includes: generating, by a pulse-width modulated (PWM) signal generator of a control circuit of an electronic converter, a pulse-width modulated (PWM) signal and providing the PWM signal to a switching stage of the electronic converter, the switching stage configured to provide a regulated output voltage at an output node based on an input voltage received at an input node, the switching stage configured to be coupled to a reactive network referred to ground. Generating the PWM signal includes: in a first operating mode, repeating the following switching phases for each switching cycle of a sequence of switching cycles: for a first switching phase, generating the PWM signal having a first logic value, and for a subsequent second switching phase, generating the PWM signal having a second logic value. The method further includes: determining, by the PWM generator in the first operating mode, a duration of the first switching phase or the second switching phase based on an error signal; determining, by the PWM generator in a second operating mode, the duration of the first switching phase or the second switching phase based on a comparison signal; generating, by an error amplifier of the control circuit, the error signal based on a difference between the reference voltage and the regulated output voltage, the error amplifier having a first error amplifier node coupled to the output node and configured to receive the regulated output voltage, and a second error amplifier node coupled to a reference voltage; generating, by a programmable voltage generator of the control circuit, a programmable offset voltage based on a digital word signal; generating, by an adder circuit of the control circuit, a sum signal based on a sum of a reference voltage level and the programmable offset voltage; generating, by a loop comparator circuit of the control circuit having a first comparator node coupled to the output node and configured to receive the regulated output voltage and a second comparator node coupled to the adder circuit and configured to receive the sum signal, the comparison signal having a first logic value in response to the regulated output voltage reaching a level of the sum signal and having a second logic value in response to the regulated output voltage failing to reach the level of the sum signal; providing, by a feedback circuit of the control circuit, the digital word signal to the programmable voltage generator, the feedback circuit coupled to the loop comparator circuit, the PWM signal generator, and the programmable voltage generator; measuring, by flagging circuitry of the feedback circuit, a difference between the duration of at least one of the first switching phase or the second switching phase between consecutive switching cycles of the sequence of switching cycles during the first operating mode; generating, by the flagging circuitry, a flag signal having the first logic value in response to the measured difference reaching a threshold value and having the second logic value in response to the measured difference failing to reach the threshold value; and varying the offset voltage generated by the programmable voltage generator by increasing or decreasing the digital word signal with respect to a preset digital word value by logic circuitry of the feedback circuit based on at least one of the flag signal or the comparison signal.

BRIEF DESCRIPTION OF THE DRAWINGS

For a more complete understanding of one or more embodiments of the present disclosure, and the advantages thereof, reference is now made to the following descriptions taken in conjunction with the accompanying drawings, in which.

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The drawings are in simplified form and are not to precise scale.

Throughout the figures annexed herein, like parts or elements are indicated with like references/numerals unless the context indicates otherwise, and for brevity a corresponding description will not be repeated for each and every figure.

The references used herein are provided merely for convenience and hence do not define the extent of protection or the scope of the embodiments.

For the sake of simplicity, in the following detailed description a same reference symbol may be used to designate both a node/line in a circuit and a signal which may occur at that node or line.

Figure 1:
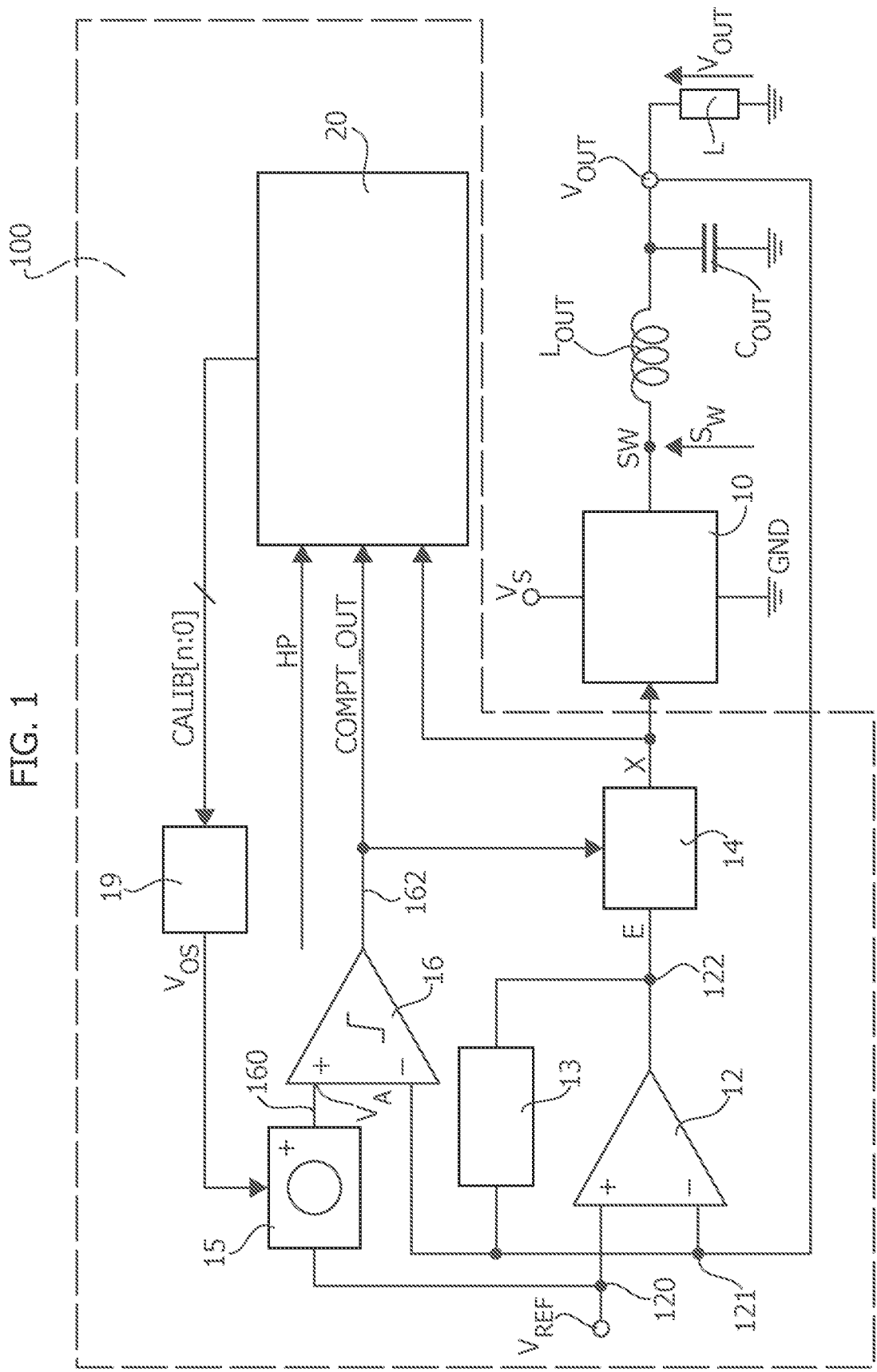
FIG. 1 is a diagram illustrating a DC-DC converter control chain, in accordance with one or more embodiments of the present disclosure.

As exemplified in FIG. 1, a DC-DC converter comprises: a supply node $V_S$ configured to be coupled to a supply voltage; a power stage 10 (known per se) comprising a low-side switch and a high-side switch having current flow paths therethrough cascaded between the supply node $V_S$ and ground GND, the low-side switch and the high side switch having a common switching node SW therebetween; a reactive network $L_{OUT}$, $C_{OUT}$, comprising an inductive circuit element $L_{OUT}$ (such as an inductor coil with respective inductance, for instance) and a capacitive circuit element $C_{OUT}$ (such as a capacitor with a respective capacitance, for instance) connected in series between the switching node SW and ground GND, and an output node OUT intermediate the inductive element $L_{OUT}$ and the capacitive element $C_{OUT}$, the output node OUT configured to be coupled to a load L to provide a regulated output voltage $V_{OUT}$ thereto.

As exemplified in FIG. 1, in order to regulate the voltage level of the regulated output voltage your, a control system wo comprises: an error amplifier circuit 12 comprising a reference input node 120 configured to receive a reference voltage $V_{REF}$, the error amplifier 12 comprising a second input node 121 coupled to the output node OUT to receive the regulated voltage $V_{OUT}$, the error amplifier 12 further comprising a feedback network 13 (e.g., an RC network)

across its second input node 121 and an output node 122, the error amplifier 12 configured to provide at an output node 122 an error signal E indicative of a difference between the regulated output voltage $V_{OUT}$ and the reference voltage $V_{REF}$; a PWM controller circuit 14 coupled to the error amplifier 12 to receive the error signal E therefrom, the PWM controller 14 configured to provide, based on the error signal E, a PWM signal X to drive the switches in the power stage 10 to have respective current flow paths therethrough (e.g., alternately) made conductive and non-conductive based on the PWM signal X, determining the regulated output voltage $V_{OUT}$ across the reactive network $L_{OUT}$, $C_{OUT}$ as a result; an adder circuit block 15 coupled to the reference node 120 and to an offset voltage generator 19, the adder circuit block 15 configured to add the reference voltage $V_{REF}$ received from the reference input node 120 and an offset voltage $V_{OS}$ generated via the offset voltage generator 19, the adder circuit block 15 providing a sum signal $V_A$ as a result, a loop comparator circuit 16 comprising a first comparator input node 160 coupled to the adder circuit 15 to receive the sum signal $V_A$ and a second comparator input node coupled to the output node OUT of the DC-DC converter via the second input node 121 of error amplifier 12, the loop comparator circuit 16 configured to perform a comparison between the output voltage $V_{OUT}$ and the sum signal $V_A$ produced by the adder circuit block 15, the loop comparator circuit 16 having an output node 162 configured to provide a comparison signal COMP_OUT indicative of a comparison result between the output voltage your and the sum signal $V_A$; the comparison signal COMP_OUT may be provided to the PWM controller 14 to drive the power stage 10 when the power stage 10 goes in DCM; for instance, the comparison signal COMP_OUT has a first logic value (e.g., "1" or "true") in case the output voltage $V_{OUT}$ is greater than the sum signal $V_A$ and a second logic value (e.g., "0" or "false") in case the output voltage $V_{OUT}$ is smaller than the sum signal $V_A$;

an offset calibration circuitry 20 coupled to the control circuit 14 to receive the PWM signal X, to the loop comparator circuit 16 to receive the comparison signal COMP_OUT and to a trigger node HP to receive a trigger signal HP (e.g. produced when CCM operational is involved, in response to a change in the load, such as an increase or a reduction thereof) indicative of a high-power operational mode of the power stage 10, the offset calibration circuitry 20 configured to check the evolution of the duty-cycle of the PWM signal X within a predefined time mask and to provide a calibration signal CALIB[n:0] (e.g., a n-bit signal) to the programmable adder circuit 15 via the offset voltage generator 19 as discussed in the following.

Figure 2:
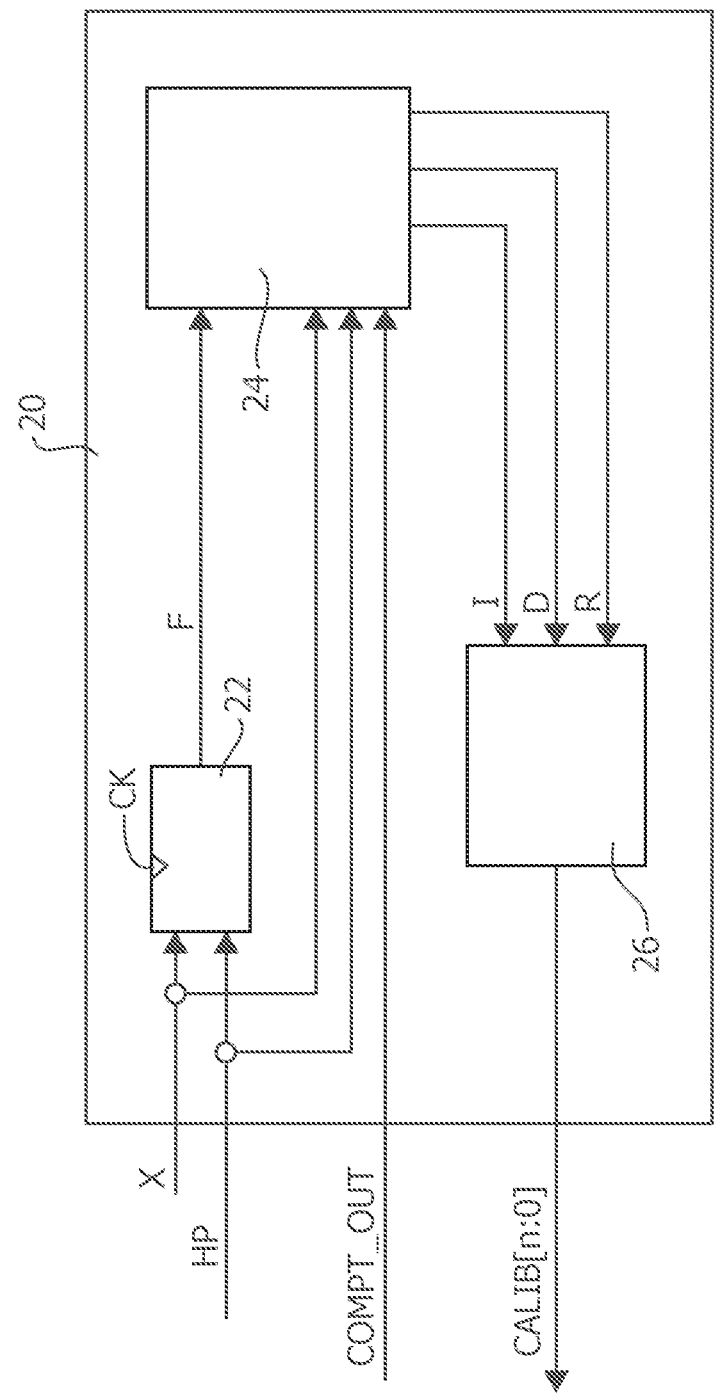
FIG. 2 is a diagram illustrating offset calibration circuitry which may be included as part of the control chain shown in FIG. 1, in accordance with one or more embodiments.

As exemplified in FIG. 2, the offset calibration circuitry 20 comprises: a flagging circuit block 22 configured to receive the trigger signal HP, the PWM signal X and a clock signal CK (which may be generated internally and provided by the flagging circuit block 22 itself), the flagging circuit block 22 configured to process the PWM signal X and to sense, e.g., period by period, the duty cycle of the PWM signal X, providing a corresponding flag signal F indicative of "flatness" thereof (e.g., a degree of invariability over time) to a downstream logic circuit block 24, as discussed in the foregoing; a logic circuit block 24 (e.g., a microcontroller unit) coupled to the flagging circuit block 22 to receive the flag signal F, to the loop comparator 16 to receive the comparison signal COMP_OUT and configured to receive the trigger signal HP and the PWM signal X, the logic circuit block 26 configured to generate a set of drive signals I, D, R for a programmable counter 26 in response to the value of the flag signal F, to the combination of the comparison signal COMP_OUT and PWM signal X, as discussed in the following; a programmable counter 26 configured to receive the drive signals I, D, R and to provide a (e.g., multi-bit) digital signal CALIB[n:0] according to the signals received from the logic circuit block 26; for instance, the programmable counter 26 is configured to: increase the value of the digital signal CALIB[n:0] in response to receiving a first drive signal I, decrease the value of the digital signal CALIB[n:0] in response to receiving a second drive signal D, reset the value of the digital signal CALIB[n:0] (e.g., to a value determined beforehand at testing level) in response to receiving a third drive signal R.

Figure 3:
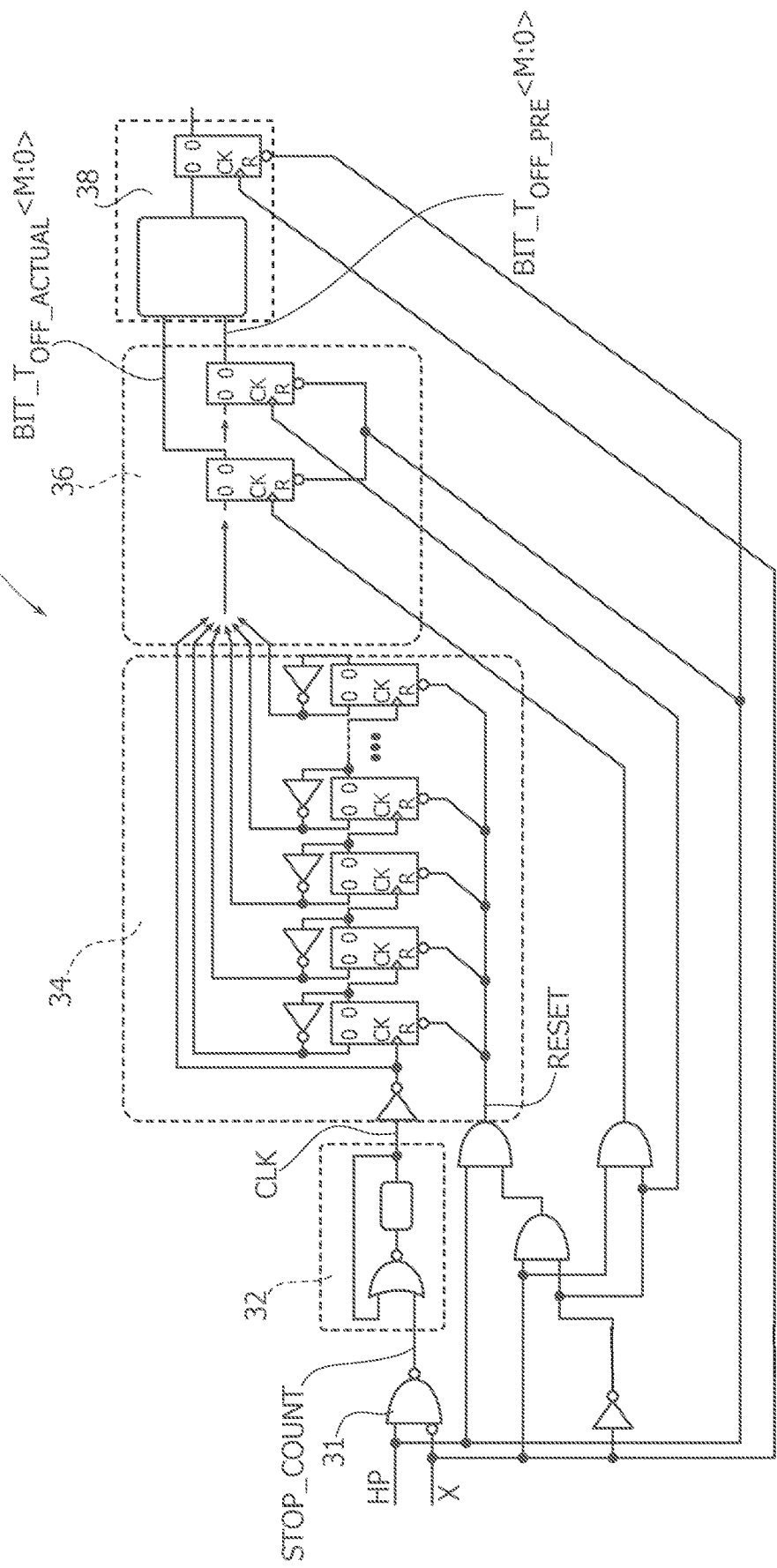
FIG. 3 is a diagram illustrating a digital circuit which may be included as part of a flagging circuit of the offset calibration circuitry shown in FIG. 2, in accordance with one or more embodiments.

As exemplified in FIG. 2, the flagging circuit block 22 processes the PWM signal X and analyses, cycle by cycle of the PWM signal X, a time interval (e.g., off-time T OFF) in which the PWM signal X is at a (e.g., low) logic level; the flagging circuit block 22 asserts the flag signal F (e.g., high or "1") in case consecutive time intervals have respective durations that differ of an amount of time lower than a predefined threshold, indicating small or negligible period by period perturbations on the regulated output voltage $V_{OUT}$ (e.g., "flat" voltage on output node OUT) as discussed in the following mainly with reference to FIG. 3.

For the sake of simplicity, one or more embodiments are discussed in the following mainly with respect to the case that the flagging circuit block 22 analyses the time interval $T_{OFF}$ in which the PWM signal X is at a low logic level, being otherwise understood that such a case is purely exemplary and in no way limiting. One or more embodiments may operate as well in the complementary case in which the flagging circuit block 22 analyses the time interval $T_{ON}$ in which the PWM signal X is at a high logic level.

For instance, it may be possible to select which time interval to analyze out of the ON time $T_{ON}$ and the OFF time $T_{OFF}$ based on the operative duty-cycle of the converter (e.g., expressed by the ratio $V_{OUT}/V_S$).

As exemplified in FIG. 2, the logic circuit block 24 produces the set of drive signals I, R, D based on the flag signal F and on the value of the comparison signal COMP_OUT over a monitoring time interval (e.g., the switching period of the PWM signal X).

For instance, when in High-Power mode (e.g., in response to the HP signal having a first logic value, e.g., "high" or "1"), the logic circuit block 24: in response to the comparison signal COMP_OUT being de-asserted (e.g., having a low or "0" logic value according to $V_{OUT} > V_A$) during the entire monitoring period (e.g., $T_{OFF}$) and of the flag signal F being asserted, the logic circuit block asserts the first signal I, driving the counter 26 to increase its value; in response to the comparison signal COMP_OUT being asserted (e.g., having a low or "0" logic value according to $V_{OUT} < V_A$) during (at least a fraction of) the monitoring period (e.g., $T_{OFF}$) and of the flag signal F being asserted, the logic circuit block 24 asserts the second signal D, driving the counter 26 to decrease its value; in response to the flag signal F being de-asserted (e.g., due to a locally perturbed output voltage $V_{OUT}$), the control logic de-asserts the first drive signal I and the second drive signal D, maintaining unaltered the value of the counter 26 as a result.

For instance, in response to asserting the first drive signal I or the second drive signal D, monitoring the evolution over time of the comparison signal COMP_OUT is interrupted for one cycle, in order to enable stabilization of the signal.

For instance, when moving from High-Power mode to Low-Power mode (e.g., HP signal having a transition from high or "1" logic value to low or "0" logic value), the logic circuit block 24 will keep de-asserted all the three drive signals I,R,D, thus maintaining the latest counter 26 value.

For instance, when moving instead from Low-Power mode to High-Power mode (e.g., HP signal having a transition from low or "0" logic value to high or "1" logic value), the logic circuit block 24 asserts the third signal R, driving the counter 26 to reset its value (e.g., reset to a value determined beforehand at testing level).

In a first scenario exemplified in FIG. 3, the flagging circuit 22 is implemented as a digital circuit 30 comprising: a logic port 31 configured to receive the trigger signal HP and the PWM signal X, generating a stop signal STOP_COUNT with a first logic value (e.g., high or "1" logic value) as soon as the PWM signal X shows a (e.g., rising) signal edge indicating the end of a period $T_{OFF}$ in which the signal X has a second (e.g., "low" or "0") logic value; a local ring oscillator 32 (e.g., with a period generally 50 to 100 times lower than the period of the PWM signal X) coupled to the logic port 31 to receive the stop count signal STOP_COUNT, the local ring oscillator 32 configured to produce a clock signal CLK in response to receiving the de-asserted signal STOP_COUNT at the beginning of each monitoring time interval (e.g., off-time $T_{OFF}$), the local ring oscillator 32 configured to remain inactive outside the same monitoring time interval (e.g., on-time $T_{ON}$); a multi-bit counter 34 (known per se) coupled to the local ring oscillator 32 to receive the clock signal CLK, the counter 34 configured to produce a multi-bit digital word signal BIT_$T_{OFF}$<M:0> based on the clock signal CLK, the multi-bit counter 34 further configured to be reset remaining inactive during the $T_{ON}$ (phase in which the PWM is high and the power stage is configured to bring the switching voltage $V_{SW}$ close to the supply voltage $V_S$); a sampler circuit 36 coupled to the multi-bit counter 34 to receive the multi-bit digital word signal BIT_$T_{OFF}$<M:0> and to apply sampling thereto, storing the sampled value BIT_$T_{OFF\_PRE}$<M: 0> at the end of the (off-)time period $T_{OFF}$ in which the PWM signal X is off, the sampler circuit 36 further configured to sample and store the subsequent multi-bit digital word signal BIT_$T_{OFF}$<M:0> at the end of the next time period $T_{OFF}$ as a second digital word signal BIT_$T_{OFF\_ACTUAL}$<M:0>; a comparator 38 (e.g., a M-bits digital absolute value differentiator) coupled to the sampler circuit 36 and configured to compare the two digital words stored therein, BIT_$T_{OFF\_PRE}$<M:0>, BIT_$T_{OFF\_ACTUAL}$<M:0>, generating an output signal which once sampled represents the "flatness" flag F to the logic circuit 24.

Figure 4:
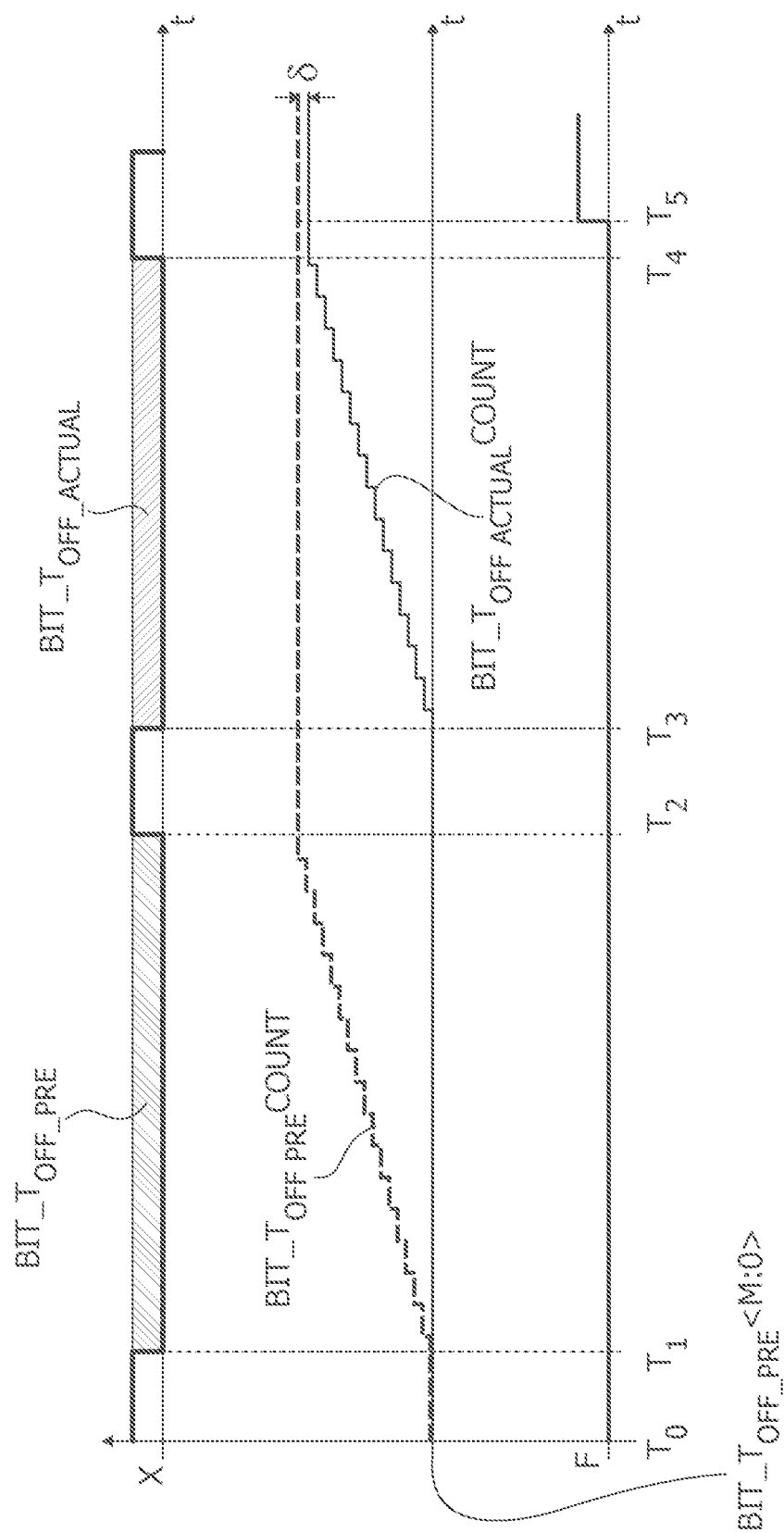
FIG. 4 is a diagram illustrating an evolution over time of signals in one or more embodiments.

For instance, as exemplified in FIG. 4: in a first time interval T0-T1, the PWM signal X is asserted, so that both the local ring oscillator 32 and the multi-bit counter 34 do not start; at the time instant $T_1$, the PWM signal X has a falling edge, signaling the beginning of a $T_{OFF}$ period; such an event triggers start of the local ring oscillator 32 and consequently the start in counting of the counter 34; at a second time instant $T_2$, the value $T_{OFF\_PRECOUNT}$ reached by the counter 34 is stored in the sampler circuit 36 as the first digital word BIT_$T_{OFF\_PRECOUNT}$<M: 0>, immediately after the local ring oscillator 32 is stopped and the multi-bit counter 34 is reset; at a third time instant $T_3$, the PWM signal X has a further falling edge, signaling the beginning of a further $T_{OFF}$ period of the PWM signal X; such an event triggers again the start of both the local ring oscillator 32 and the multi-bit counter 34; at a fourth time instant $T_4$, the value $T_{OFF\_ACTUALCOUNT}$ reached by the multi-bit counter 34 is stored in the sampler circuit 36 as the second digital word BIT_$T_{OFF\_ACTUAL}$<M: 0>, immediately after the local ring oscillator is stopped and the multi-bit counter is reset; at a fifth time instant $T_5$, following $T_4$ but during a temporal window in which the monitoring is stopped (e.g., during the on-time $T_{ON}$) the comparator 38 asserts or de-asserts the flag signal F as a result of the comparison between the difference $\delta$ between the first stored value $T_{OFF\_PRECOUNT}$ and the second stored value $T_{OFF\_ACTUALCOUNT}$ and a predefined threshold (e.g., if the difference $\delta$ of the two off-time durations is lower than the predefined threshold F is asserted indicating small or negligible perturbations on the output regulated voltage $V_{OUT}$).

In one or more embodiments the local ring oscillator 32 can be externally provided and thus considered as an input signal of the possible digital implementation 30 of the flagging circuit block 22.

In one or more embodiments the predefined threshold used to compare the difference $\delta$ of the two off-time durations can be programmable and externally provided.

Figure 5:
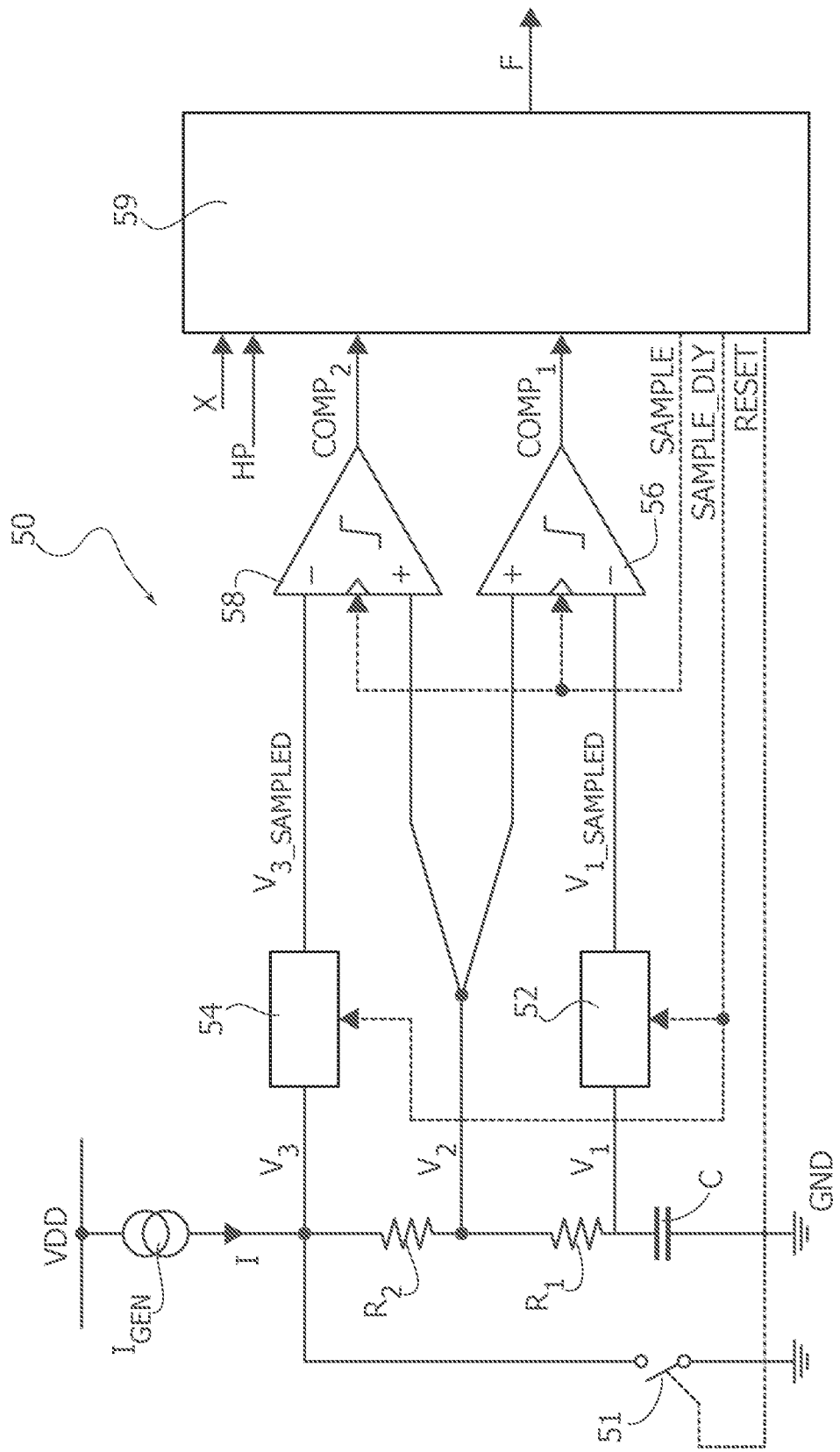
FIG. 5 is a diagram illustrating an analog circuit which may be included as part of the flagging circuit of the offset calibration circuitry, in accordance with one or more embodiments.

As exemplified in FIG. 5, an alternative analog implementation 50 of the flagging circuit block 22 comprises: a supply line VDD and a current generator $I_{GEN}$ configured to produce a current I, a first current flow line for the current I produced by the generator between a third voltage node V3 and ground GND, the first current flow line comprising a series of resistive elements R1, R2 and a capacitive element C; the capacitive element has a voltage V1 referred to ground GND at a first voltage node V1; the first resistive element R1 has a voltage drop across its ends as a difference between a second voltage node V2 and the first voltage node V1; the second resistive element R2 has a voltage drop across its ends as a difference between the voltages at the third voltage node V3 and at the second voltage node V2; a second current flow line between the third voltage node V3 and ground GND, the second current flow line comprising a switch 51 configured to be driven between a conductive state and a non-conductive state via a reset signal RESET; a first sample and hold (briefly, S&H) circuit 52 coupled to the first voltage node V1 and configured to sample the value of the first voltage V1, providing a first sampled voltage V1 as a result, and a second S&H circuit 54 coupled to the third voltage node V3 and configured to sample the value of the third voltage V3, providing a third sampled voltage V3_sampled as a result, the first 52 and second 54 S&H circuits configured to receive a sampling signal SAMPLE_DLY that determines the time instant at which the sampling is performed; a first window comparator 56 having a first comparator input node coupled to the first S&H circuit 52 to receive the first sampled voltage V1_sampled and a second comparator input node coupled to the second voltage node V2 to receive the second voltage V2, the first window comparator 56 configured to receive a timing signal SAMPLE and to perform a comparison between the first sampled voltage V1_sampled and the second voltage V2 at time instants determined based on the clock signal SAMPLE, producing a first comparison signal COMP1 as a result, and a second window comparator 58 having a first comparator input node coupled to the second S&H circuit 56 to receive the third sampled voltage V3_sampled and a second comparator input node coupled to the second voltage node V2 to receive the second voltage V2, the second window comparator 58 configured to receive the timing signal SAMPLE and to perform a comparison between the third sampled voltage V3_sampled and the second voltage V2 at time instants determined based on the clock signal SAMPLE, producing a second comparison signal COMP2 as a result, and a flagging circuit logic 59 coupled to the first 56 and second 58 comparator to receive the first COMP1 and second COMP2 comparison signals, the PWM signal X and the trigger signal HP indicating the High-Power mode condition, the flagging circuit logic 59 configured to produce the sampling signal SAMPLE, the sampling signal SAMPLE_DLY obtained as delayed version of the sampling signal SAMPLE and the RESET signal for the S&H circuits 52,54, the comparator circuits 56,58 and the switch 51, respectively, based on the PWM signal X and the trigger signal HP received.

As exemplified herein, the circuit 5o is aimed at performing a comparison of an actual length of the OFF-time interval (which is detected via the second voltage signal V2) with a temporal interval indicative of the length of the OFF-time interval in a previous period of the switching signal X (the temporal interval being a function of the sampled signals V1 and V3).

Figure 6:
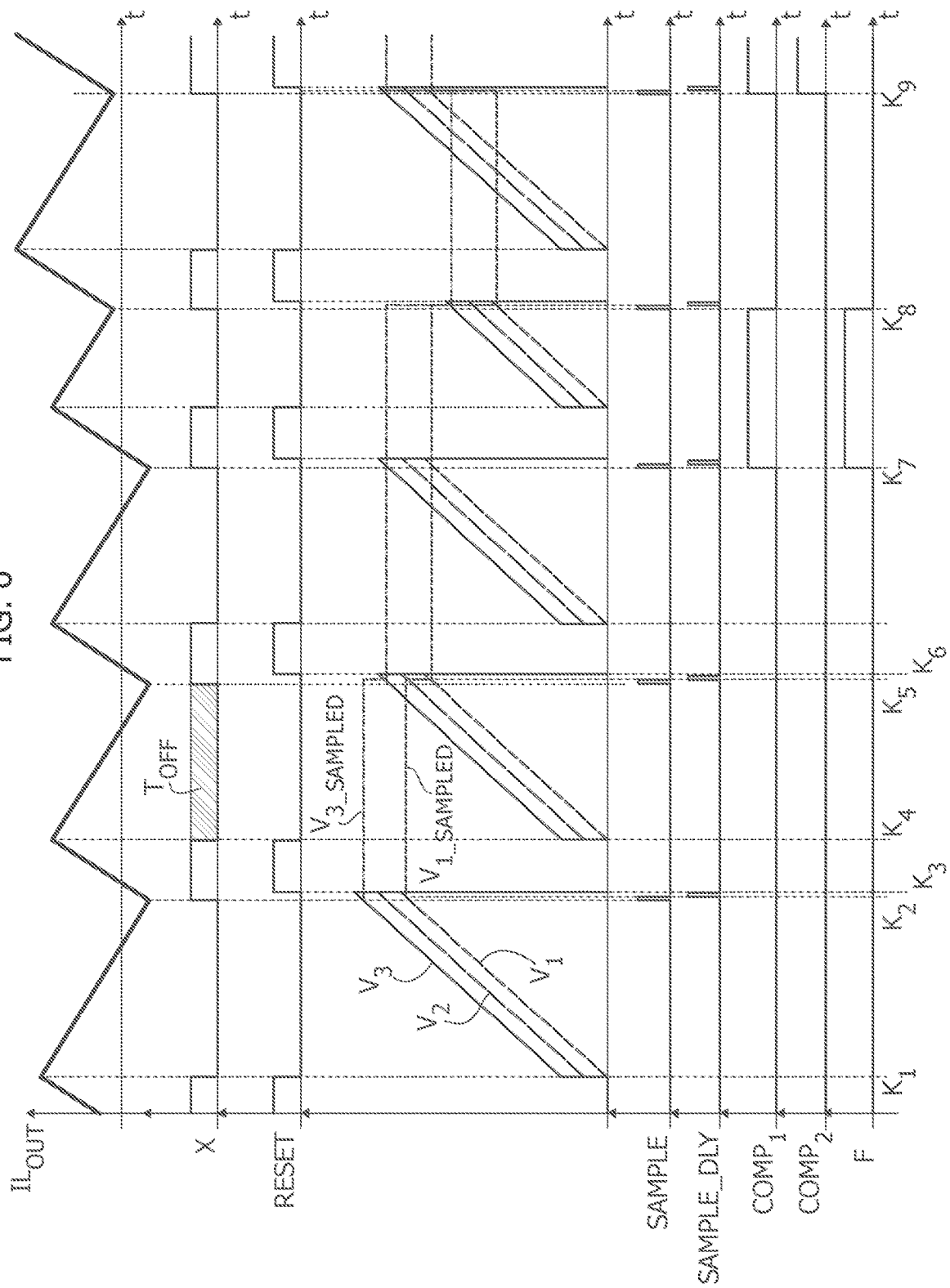
FIGS. 6 and 7 are diagrams illustrating an evolution over time of signals in one or more embodiments.

As exemplified in FIG. 6, operation of the alternative flagging circuit 5o comprises: at a first time instant K1, the RESET signal is de-asserted so that the current I from the current generator $I_{GEN}$ flows in the first current flow line R1, R2, C, at a second time instant K2, in correspondence to the off-time $T_{OFF}$ ending and PWM signal X transition from "0" logic state to "1" logic state, the sampling signal SAMPLE is asserted enabling the comparison of 56, 58, thus updating the logic states of COMP1, COMP2; immediately after the time instant K2, as soon as the COMP1, COMP2 comparison phase is finished, the second sampling signal SAMPLE_DLY is asserted with the first sampled voltage V1_SAMPLED and the third sampled voltage V3_SAMPLED as a result; at a third time instant K3, following K2 as soon as the sampling phase of V1_SAMPLED and V3_SAMPLED is finished, the RESET signal is asserted again, so that the switch 51 is closed and the current I from the current generator $I_{GEN}$ flows in the second current flow line; for instance, as a result of both comparison signals $COMP_1$ and $COMP_2$ being both low or both high, the flag signal F is de-asserted, otherwise the signal F is asserted indicating small or negligible perturbations on the output regulated voltage $V_{OUT}$.

For instance, the above operations are repeated at subsequent time intervals K4, K5, K6 and for every switching cycle of the PWM signal X.

As exemplified in FIG. 6: at time instant K7 the first comparison signal COMP1 goes high while the second comparison signal COMP2 remains low; as a result, the flag signal F is asserted; at a further time instant K9, as both comparison signals COMP1 and COMP2 are asserted, indicating that in correspondence of the SAMPLE pulse V2 results greater than both V1_SAMPLED and V3_SAMPLED, the flag signal is de-asserted.

Figure 7:
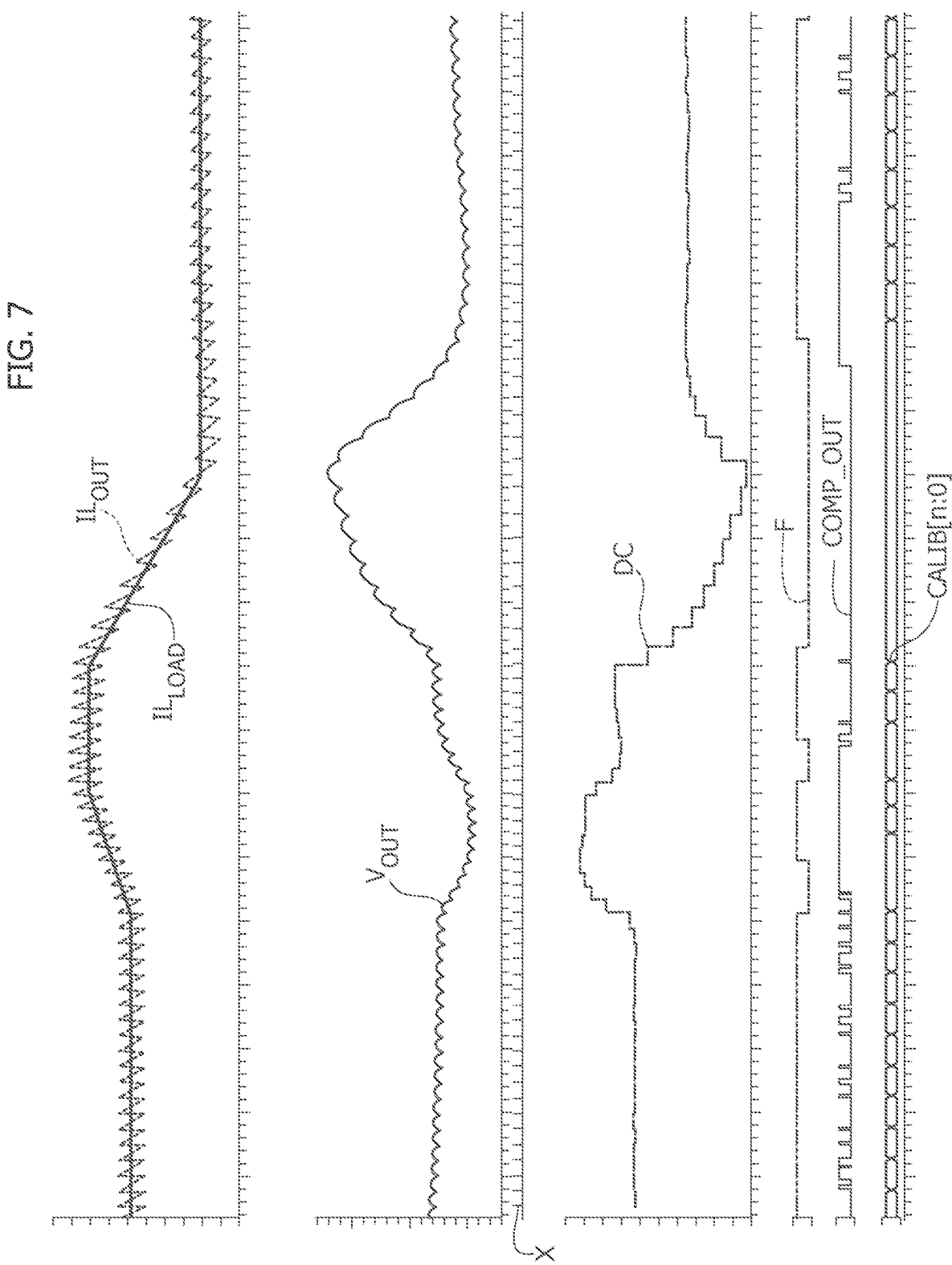

As exemplified in FIG. 7, where the converter is working in High-Power mode (e.g., HP trigger signal asserted): the flag signal F is asserted (e.g., high or "1") while the duty cycle DC of the PWM signal X is almost unchanged period by period, thus indicating a "flat" voltage $V_{OUT}$ on the output node OUT (in the areas circled in dashed lines), in such a condition, the calibration signal CALIB[n:0] varies as discussed in the foregoing; correspondingly, the programmable offset voltage $V_{OS}$ value generated by offset voltage generator 19 also varies; an equilibrium is reached when the comparison signal COMP_OUT is stable (e.g., does not show transitions within a single switching period), the equilibrium being indicative that the sum signal $V_A$ provided as a comparison threshold voltage to the loop comparator 16, has reached an (dynamically) adjusted value corresponding to a state transition of the comparison signal COMP_OUT in correspondence to the minimum voltage value of the output node OUT along the single switching period (e.g., also indicated as valley voltage of the output ripple).

In one or more embodiments, the calibration signal CALIB[n:0] and the programmable offset voltage $V_{OS}$ generated by the offset voltage generator 19 continuously varies until a pulse duration of the comparison signal COMP_OUT within the single switching cycle is reduced to a (at least notionally) minimum yet non-zero value.

Figure 8A:
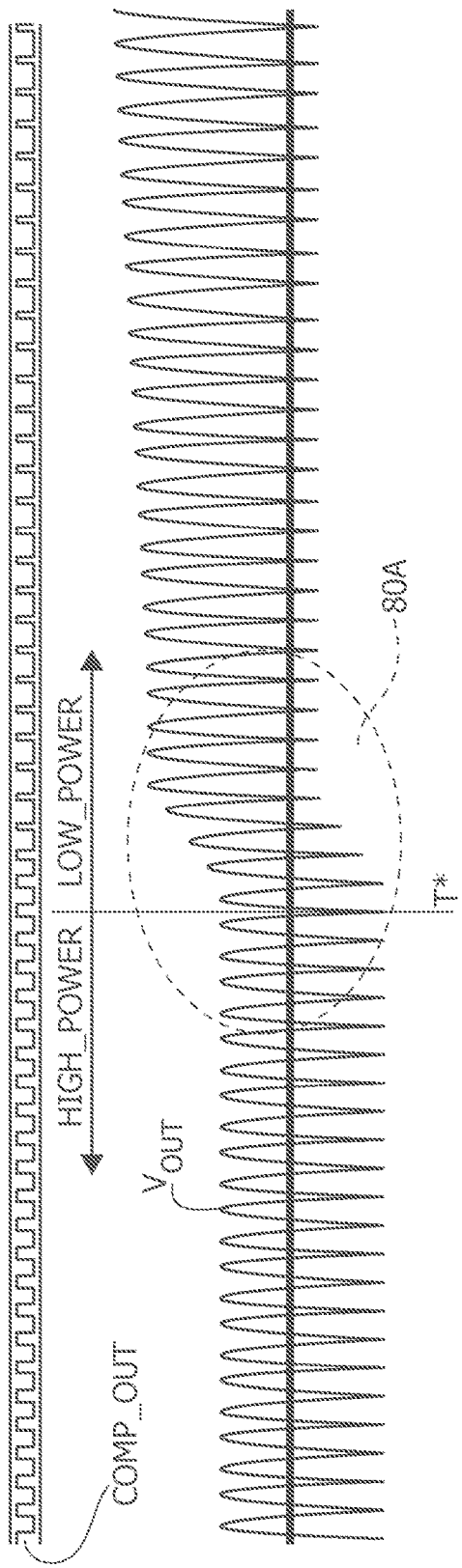
FIGS. 8A and 8B are further diagrams illustrating an evolution over time of signals in one or more embodiments.

As exemplified in FIG. 8A, conventional solutions exhibit a jump in the output voltage VOUT at a time instant T* indicating the passing from CCM (high-power) to DCM (low-power) operation of the power stage 10, as highlighted via the dashed circle 80A.

Figure 8B:
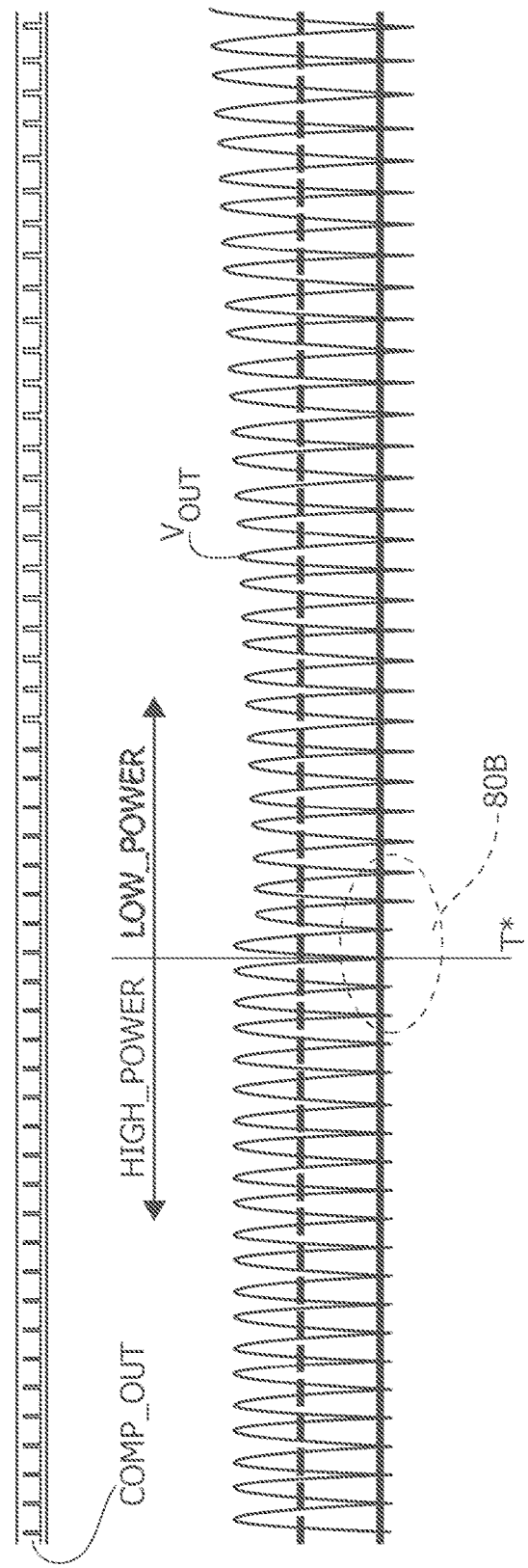

Conversely, as exemplified in FIG. 8B, a solution as exemplified herein reduces the fluctuation in the output voltage when transitioning at T* from the CCM (high power) operating mode to the DCM (low-power) operating mode thanks to the pre-compensation of the offset $V_{OS}$ for the loop comparator 16.

As exemplified in FIG. 8B, the output comparison signal COMP_OUT maintains a minimum duration K almost unvaried between high power and low power mode.

As exemplified in FIGS. 8A and 8B, thanks to the solution as exemplified herein, the output comparison signal COMP_OUT has a shorter pulse duration (as appreciable by naked eye comparison of FIGS. 8A and 8B) than the pulse duration K0 that it would have in conventional solutions.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection.

What is claimed is:

1. A control circuit for a switching stage of an electronic converter configured to provide a regulated output voltage at an output node based on an input voltage received at an input node, the switching stage configured to be coupled to a reactive network referred to ground, the control circuit comprising:
   a pulse-width modulated (PWM) signal generator configured to generate a PWM signal to drive the switching stage;
   an error amplifier having a first error amplifier node coupled to the output node and configured to receive the regulated output voltage, and a second error amplifier node coupled to a reference voltage, the error amplifier configured to generate an error signal based on a difference between the reference voltage and the regulated output voltage;
   a programmable voltage generator configured to generate a programmable offset voltage based on a digital word signal;
   an adder circuit coupled to the programmable voltage generator and configured to receive the programmable offset voltage, the adder circuit being configured to generate a sum signal based on a sum of a reference voltage level and the programmable offset voltage;

a loop comparator circuit having a first comparator node coupled to the output node and configured to receive the regulated output voltage and a second comparator node coupled to the adder circuit and configured to receive the sum signal, the loop comparator circuit configured to generate a comparison signal having a first logic value in response to the regulated output voltage reaching a level of the sum signal and having a second logic value in response to the regulated output voltage failing to reach the level of the sum signal;

wherein, in a first operating mode, the PWM signal generator is configured to repeat the following switching phases for each switching cycle of a sequence of switching cycles:

for a first switching phase, generate the PWM signal having a first logic value, and for a subsequent second switching phase, generate the PWM signal having a second logic value, wherein, in the first operating mode, the PWM generator is configured to determine the duration of the first switching phase or the second switching phase based on the error signal, wherein, in a second operating mode, the PWM generator is configured to determine the duration of the first switching phase or the second switching phase based on the comparison signal;

the control circuit further comprising:

a feedback circuit coupled to the loop comparator circuit, the PWM signal generator, and the programmable voltage generator, the feedback circuit configured to receive the comparison signal, receive the PWM signal, and to provide the digital word signal to the programmable voltage generator, the feedback circuit comprising:

flagging circuitry configured to measure a difference between the duration of at least one of the first switching phase or the second switching phase between consecutive switching cycles of the sequence of switching cycles during the first operating mode and to generate a flag signal having the first logic value in response to the measured difference reaching a threshold value and having the second logic value in response to the measured difference failing to reach the threshold value; and logic circuitry configured to, based on at least one of the flag signal or the comparison signal, increase or decrease the digital word signal with respect to a preset digital word value, and vary the offset voltage generated by the programmable voltage generator.

2. The control circuit of claim 1, wherein, during the first operating mode, the logic circuitry is configured to:

in response to the flag signal having the first logic value and the comparison signal having the second logic value over an entire switching cycle, increase the digital word value of the digital word signal;

in response to the flag signal having the first logic value and the comparison signal having the first logic value over an entire switching cycle, decrease the digital word value of the digital word signal; and in response to the flag signal having the second logic value, store the digital word value of the digital word signal.

3. The control circuit of claim 1, wherein, during the second operating mode, the logic circuitry is configured to store the digital word value of the digital word signal reached by the feedback circuit at the end of the first operating mode.

4. The control circuit of claim 1, wherein the logic circuitry is configured to set the digital word value of the digital word signal to the preset digital word value in response to the control circuit switching from the second operating mode to the first operating mode.

5. The control circuit of claim 1, wherein the flagging circuitry comprises:

a multi-bit counter configured to generate a multi-bit digital word signal indicative of a measured duration of the first switching phase or the second switching phase of each switching cycle of the sequence of switching cycles;

a sampler circuit coupled to the multi-bit counter and configured to receive each multi-bit digital word signal and to apply digital sampling thereto, the sampler circuit configured to store consecutive sampled values and to reset the multi-bit counter at the end of the first switching phase or the second switching phase of each switching cycle of the sequence of switching cycles; and a further comparator coupled to the sampler circuit and configured to compare the consecutive sampled values stored therein, the further comparator configured to measure a difference between the consecutive sampled values and to generate the flag signal having the first logic value in response to the measured difference reaching the threshold value and having the second logic value in response to the measured difference failing to reach the threshold value.

6. The control circuit of claim 1, wherein the flagging circuitry comprises:

a current generator configured to generate a current;

a first current flow line coupled to the current generator and extending between a first voltage at a first voltage node and ground, the first current flow line comprising a first resistive element, a second resistive element and a capacitive element arranged in series between the first voltage node and the ground node;

a second current flow line coupled to the current generator and extending between the first voltage node and ground, the second current flow line comprising a switch configured to be driven between a conductive state and a non-conductive state by a reset signal, wherein, in the first current flow line:

the capacitive element is coupled between a second voltage at a second voltage node and ground;

the first resistive element is coupled between a third voltage at a third voltage node and the second voltage node; and the second resistive element is coupled between the first voltage node and the second voltage node;

the flagging circuitry further comprising:

flagging logic circuitry coupled to the PWM generator and configured to receive the PWM signal, the flagging logic circuitry coupled to the switch in the second current flow line and configured to provide the reset signal thereto, the flagging logic circuitry configured to generate the reset signal having the first logic value in response to the PWM signal having the first logic value and having the second logic value in response to the PWM signal having the second logic value, wherein, in response to the reset signal having the second logic value, the switch is driven to the non-conductive state, and the current generated by the current generator flows through the first current flow line;

a first window comparator configured to generate a first comparison signal based on a comparison between the first voltage at the first voltage node and the third voltage at the third voltage node; and
a second window comparator configured to generate a second comparison signal based on a comparison between the second voltage at the second voltage node and the third voltage at the third voltage node,
wherein the flagging logic circuitry is coupled to the first window comparator and to the second window comparator and configured to receive the first comparison signal and the second comparison signal, the flagging logic circuitry configured to generate the flag signal having the first logic value in response to the first comparison signal and the second comparison signal having different values, and to generate the flag signal having the second logic value in response to the first comparison signal and the second comparison signal having a same value.

7. The control circuit of claim 1, wherein the PWM generator is configured to switch from the first operating mode to the second operating mode based on a control signal.

8. The control circuit of claim 7, wherein the regulated output voltage varies smoothly in response to switching from the first operating mode to the second operating mode.

9. An electronic converter, comprising:
a first node configured to receive an input voltage;
an output node configured to provide a regulated output voltage;
a load coupled to the output node and configured to receive the regulated output voltage;
a switching node coupled to a reactive network referred to ground;
a switching stage coupled to the first node and to the switching node; and
a control circuit coupled to the switching stage and configured to provide at least one pulse-width modulated (PWM) signal to the switching stage based on the regulated output voltage and a reference voltage, the control circuit comprising:
 a PWM signal generator configured to generate the PWM signal to drive the switching stage;
 an error amplifier having a first error amplifier node coupled to the output node and configured to receive the regulated output voltage, and a second error amplifier node coupled to the reference voltage, the error amplifier configured to generate an error signal based on a difference between the reference voltage and the regulated output voltage;
 a programmable voltage generator configured to generate a programmable offset voltage based on a digital word signal;
 an adder circuit coupled to the programmable voltage generator and configured to receive the programmable offset voltage, the adder circuit being configured to generate a sum signal based on a sum of a reference voltage level and the programmable offset voltage;
 a loop comparator circuit having a first comparator node coupled to the output node and configured to receive the regulated output voltage and a second comparator node coupled to the adder circuit and configured to receive the sum signal, the loop comparator circuit configured to generate a comparison signal having a first logic value in response to the regulated output voltage reaching a level of the sum signal and having a second logic value in response to the regulated output voltage failing to reach the level of the sum signal;
 wherein, in a first operating mode, the PWM signal generator is configured to repeat the following switching phases for each switching cycle of a sequence of switching cycles:
 for a first switching phase, generate the PWM signal having a first logic value, and
 for a subsequent second switching phase, generate the PWM signal having a second logic value,
 wherein, in the first operating mode, the PWM generator is configured to determine the duration of the first switching phase or the second switching phase based on the error signal,
 wherein, in a second operating mode, the PWM generator is configured to determine the duration of the first switching phase or the second switching phase based on the comparison signal;
 the control circuit further comprising:
 a feedback circuit coupled to the loop comparator circuit, the PWM signal generator, and the programmable voltage generator, the feedback circuit configured to receive the comparison signal, receive the PWM signal, and to provide the digital word signal to the programmable voltage generator, the feedback circuit comprising:
  flagging circuitry configured to measure a difference between the duration of at least one of the first switching phase or the second switching phase between consecutive switching cycles of the sequence of switching cycles during the first operating mode and to generate a flag signal having the first logic value in response to the measured difference reaching a threshold value and having the second logic value in response to the measured difference failing to reach the threshold value; and
  logic circuitry configured to, based on at least one of the flag signal or the comparison signal, increase or decrease the digital word signal with respect to a preset digital word value, and vary the offset voltage generated by the programmable voltage generator.

10. The electronic converter of claim 9, wherein, during the first operating mode, the logic circuitry is configured to:
in response to the flag signal having the first logic value and the comparison signal having the second logic value over an entire switching cycle, increase the digital word value of the digital word signal;
in response to the flag signal having the first logic value and the comparison signal having the first logic value over an entire switching cycle, decrease the digital word value of the digital word signal; and
in response to the flag signal having the second logic value, store the digital word value of the digital word signal.

11. The electronic converter of claim 9, wherein, during the second operating mode, the logic circuitry is configured to store the digital word value of the digital word signal reached by the feedback circuit at the end of the first operating mode.

12. The electronic converter of claim 9, wherein the logic circuitry is configured to set the digital word value of the digital word signal to the preset digital word value in response to the control circuit switching from the second operating mode to the first operating mode.

13. The electronic converter of claim 9, wherein the flagging circuitry comprises:
- a multi-bit counter configured to generate a multi-bit digital word signal indicative of a measured duration of the first switching phase or the second switching phase of each switching cycle of the sequence of switching cycles;
- a sampler circuit coupled to the multi-bit counter and configured to receive each multi-bit digital word signal and to apply digital sampling thereto, the sampler circuit configured to store consecutive sampled values and to reset the multi-bit counter at the end of the first switching phase or the second switching phase of each switching cycle of the sequence of switching cycles; and
- a further comparator coupled to the sampler circuit and configured to compare the consecutive sampled values stored therein, the further comparator configured to measure a difference between the consecutive sampled values and to generate the flag signal having the first logic value in response to the measured difference reaching the threshold value and having the second logic value in response to the measured difference failing to reach the threshold value.

14. The electronic converter of claim 9, wherein the flagging circuitry comprises:
- a current generator configured to generate a current;
- a first current flow line coupled to the current generator and extending between a first voltage at a first voltage node and ground, the first current flow line comprising a first resistive element, a second resistive element and a capacitive element arranged in series between the first voltage node and the ground node;
- a second current flow line coupled to the current generator and extending between the first voltage node and ground, the second current flow line comprising a switch configured to be driven between a conductive state and a non-conductive state by a reset signal,
  wherein, in the first current flow line:
  - the capacitive element is coupled between a second voltage at a second voltage node and ground;
  - the first resistive element is coupled between a third voltage at a third voltage node and the second voltage node; and
  - the second resistive element is coupled between the first voltage node and the second voltage node;
  the flagging circuitry further comprising:
- flagging logic circuitry coupled to the PWM generator and configured to receive the PWM signal, the flagging logic circuitry coupled to the switch in the second current flow line and configured to provide the reset signal thereto, the flagging logic circuitry configured to generate the reset signal having the first logic value in response to the PWM signal having the first logic value and having the second logic value in response to the PWM signal having the second logic value, wherein, in response to the reset signal having the second logic value, the switch is driven to the non-conductive state, and the current generated by the current generator flows through the first current flow line;
- a first window comparator configured to generate a first comparison signal based on a comparison between the first voltage at the first voltage node and the third voltage at the third voltage node; and
- a second window comparator configured to generate a second comparison signal based on a comparison between the second voltage at the second voltage node and the third voltage at the third voltage node, wherein the flagging logic circuitry is coupled to the first window comparator and to the second window comparator and configured to receive the first comparison signal and the second comparison signal, the flagging logic circuitry configured to generate the flag signal having the first logic value in response to the first comparison signal and the second comparison signal having different values, and to generate the flag signal having the second logic value in response to the first comparison signal and the second comparison signal having a same value.

15. The electronic converter of claim 9, wherein the PWM generator is configured to switch from the first operating mode to the second operating mode based on a control signal.

16. The electronic converter of claim 9, wherein the regulated output voltage varies smoothly in response to switching from the first operating mode to the second operating mode.

17. A method, comprising:
- generating, by a pulse-width modulated (PWM) signal generator of a control circuit of an electronic converter, a PWM signal and providing the PWM signal to a switching stage of the electronic converter, the switching stage configured to provide a regulated output voltage at an output node based on an input voltage received at an input node, the switching stage configured to be coupled to a reactive network referred to ground, the generating the PWM signal including:
  - in a first operating mode, repeating the following switching phases for each switching cycle of a sequence of switching cycles:
    - for a first switching phase, generating the PWM signal having a first logic value, and
    - for a subsequent second switching phase, generating the PWM signal having a second logic value;
- determining, by the PWM generator in the first operating mode, a duration of the first switching phase or the second switching phase based on an error signal;
- determining, by the PWM generator in a second operating mode, the duration of the first switching phase or the second switching phase based on a comparison signal;
- generating, by an error amplifier of the control circuit, the error signal based on a difference between a reference voltage and the regulated output voltage, the error amplifier having a first error amplifier node coupled to the output node and configured to receive the regulated output voltage, and a second error amplifier node coupled to the reference voltage;
- generating, by a programmable voltage generator of the control circuit, a programmable offset voltage based on a digital word signal;
- generating, by an adder circuit of the control circuit, a sum signal based on a sum of a reference voltage level and the programmable offset voltage;
- generating, by a loop comparator circuit of the control circuit having a first comparator node coupled to the output node and configured to receive the regulated output voltage and a second comparator node coupled to the adder circuit and configured to receive the sum signal, the comparison signal having a first logic value in response to the regulated output voltage reaching a level of the sum signal and having a second logic value in response to the regulated output voltage failing to reach the level of the sum signal;

providing, by a feedback circuit of the control circuit, the digital word signal to the programmable voltage generator, the feedback circuit coupled to the loop comparator circuit, the PWM signal generator, and the programmable voltage generator;

measuring, by flagging circuitry of the feedback circuit, a difference between the duration of at least one of the first switching phase or the second switching phase between consecutive switching cycles of the sequence of switching cycles during the first operating mode;

generating, by the flagging circuitry, a flag signal having the first logic value in response to the measured difference reaching a threshold value and having the second logic value in response to the measured difference failing to reach the threshold value; and varying the offset voltage generated by the programmable voltage generator by increasing or decreasing the digital word signal with respect to a preset digital word value by logic circuitry of the feedback circuit based on at least one of the flag signal or the comparison signal.

18. The method of claim 17, further comprising:
during the first operating mode:

increasing the digital word value of the digital word signal in response to the flag signal having the first logic value and the comparison signal having the second logic value over an entire switching cycle;

decreasing the digital word value of the digital word signal in response to the flag signal having the first logic value and the comparison signal having the first logic value over an entire switching cycle; and storing the digital word value of the digital word signal in response to the flag signal having the second logic value.

19. The method of claim 17, further comprising:
during the second operating mode, storing the digital word value of the digital word signal reached by the feedback circuit at the end of the first operating mode.

20. The method of claim 17, further comprising:
setting the digital word value of the digital word signal to the preset digital word value in response to the control circuit switching from the second operating mode to the first operating mode.

\* \* \* \* \*